US008969782B2

(12) United States Patent
Sohn (10) Patent No.: US 8,969,782 B2
(45) Date of Patent: Mar. 3, 2015

(54) SIGNAL SAMPLING CIRCUIT AND IMAGE SENSOR HAVING THE SAME

(75) Inventor: Young-Chul Sohn, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 313 days.

(21) Appl. No.: 13/607,123

(22) Filed: Sep. 7, 2012

(65) Prior Publication Data
US 2013/0161494 A1    Jun. 27, 2013

(30) Foreign Application Priority Data
Dec. 22, 2011 (KR) .......................... 10-2011-0140393

(51) Int. Cl.
*H01J 40/14*    (2006.01)
*H01J 27/00*    (2006.01)

(52) U.S. Cl.
USPC ................ 250/214 R; 250/214 C; 250/208.1; 327/100; 327/514; 348/241; 348/303

(58) Field of Classification Search
USPC ..... 250/214 R, 214 P, 214 C, 208.1; 327/100, 327/331, 334, 514; 348/222.1, 241, 303, 348/322
See application file for complete search history.

(56) References Cited

U.S. PATENT DOCUMENTS 6,157,220 A  *  12/2000  Broekaert ....................... 327/65

* cited by examiner

*Primary Examiner* — Kevin Pyo
(74) *Attorney, Agent, or Firm* — IP & T Group LLP (57) ABSTRACT

A signal sampling circuit includes: a signal output unit configured to output a level signal to an output node in response to a control signal; a signal sampling unit coupled to the output node and configured to sample the level signal in a sampling period; a first current sinking unit configured to sink a constant current from the output node; and a second current sinking unit configured to sink a current from the output node after a time point where the control signal is deactivated.

15 Claims, 5 Drawing Sheets

SIGNAL SAMPLING CIRCUIT AND IMAGE SENSOR HAVING THE SAME

CROSS-REFERENCE TO RELATED APPLICATIONS

The present application claims priority of Korean Patent Application No. 10-2011-0140393, filed on Dec. 22, 2011, which is incorporated herein by reference in its entirety.

BACKGROUND

1. Field

Exemplary embodiments of the present invention relate to a signal sampling circuit and an image sensor having the same.

2. Description of the Related Art

Recently, the demand for digital cameras has explosively increased with the development of visual communication using the Internet. Furthermore, with the increase in spread of mobile communication terminals with a camera, such as a PDA (Personal Digital Assistant), an IMT-2000 (International Mobile Telecommunications-2000) terminal, and a CDMA (Code Division Multiple Access) terminal, the demand for small-sized camera modules has increased.

A camera module basically includes an image sensor. In general, an image sensor refers to a device which converts an optical image into an electrical signal. As such an image sensor, a charge coupled device (CCD) and a complementary metal-oxide-semiconductor (CMOS) image sensor have been widely used.

The CCD has a complicated driving method and high power consumption. Furthermore, since the number of mask processes is relatively large during a fabrication process thereof, the fabrication process is complex. In addition, since a signal processing circuit cannot be implemented in a chip, it is difficult to implement the CCD in one chip. The CMOS image sensor may be formed in a monolithic integrated circuit including control, driving, and signal processing units. Accordingly, the CMOS image sensor has come into the spotlight. Furthermore, the CMOS image sensor may operate at a low voltage, have low power consumption, feature compatibility with peripheral devices, and exhibit usefulness in a standard CMOS fabrication process. The CMOS image sensor may be fabricated at a low cost.

A unit pixel of the CMOS sensor includes a photo-diode, a transmission transistor, a reset transistor, a driving transistor, and a selection transistor. The respective transistors operate to sample a video signal based on a reset voltage and photo-charges received in the photo-diode. The sampled signal is converted into pixel data.

Figure 1:
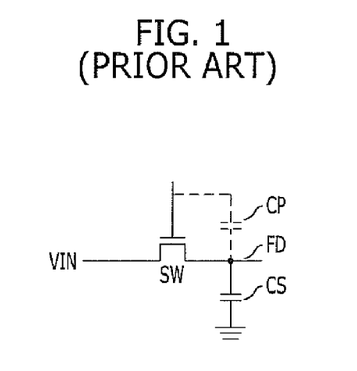
FIG. 1 is a circuit diagram schematically illustrating a switch SW serving as a reset or transmission transistor and a floating capacitor CS of a floating diffusion node FD.

FIG. 1 is a circuit diagram schematically illustrating a switch SW, serving as a reset or transmission transistor, and a floating capacitor CS of a floating diffusion node FD. FIG. 1 illustrates a switch SW, which is configured to output an input signal VIN to the floating diffusion node FD through a switching operation responding to a control signal CON, and a sampling capacitor CS which is configured to sample the signal outputted from the switch SW. Since such a circuit uses a metal oxide semiconductor (MOS) transistor as the switch, clock feedthrough or a charge injection error may occur.

The clock feedthrough or charge injection error refers to noise which occurs due to a parasitic capacitor CP existing between a gate and a drain of the MOS transistor or between the gate and a source of the MOS transistor, when the MOS transistor is switched from on to off, in case where the MOS transistor is used as the switch SW. Such noise may degrade the quality of an image generated through the image sensor.

SUMMARY

An embodiment of the present invention is directed to a signal sampling circuit having a high sampling speed while removing noise caused by clock feedthrough and an image sensor having the same.

In accordance with an embodiment of the present invention, a signal sampling circuit includes: a signal output unit configured to output a level signal to an output node in response to a control signal; a signal sampling unit coupled to the output node and configured to sample the level signal in a sampling period; a first current sinking unit configured to sink a constant current from the output node; and a second current sinking unit configured to sink a current from the output node after a time point where the control signal is deactivated.

In accordance with another embodiment of the present invention, an image sensor includes a pixel unit configured to output a pixel signal to an output node in response to a reset signal or transmission signal; a signal sampling unit coupled to the output node and configured to sample the pixel signal in a first sampling period or second sampling period; a first current sinking unit configured to sink a constant current from the output node; and a second current sinking unit configured to sink a current from the output node after one or more time points of a time point where the reset signal is deactivated and a time point where the transmission signal is deactivated.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
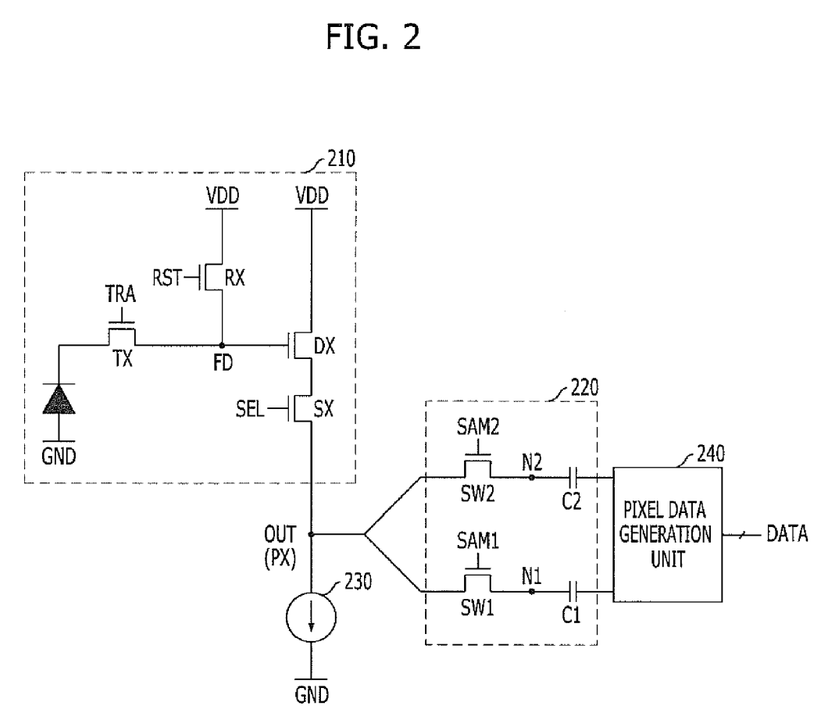
FIG. 2 is a configuration diagram of an image sensor.

FIG. 2 is a configuration diagram of an image sensor.

Referring to FIG. 2, the image sensor includes a pixel unit 210, a signal sampling unit 220, a first current sinking unit 230, and a pixel data generation unit 240. The pixel unit 210 includes a photo-diode PD, a reset transistor RX, and a transmission transistor TX, a driving transistor DX, and a selection transistor SX.

Hereafter, referring to FIG. 2, the image sensor will be described.

The pixel unit 210 is configured to output a pixel signal PX to an output node OUT when the pixel unit 210 is selected to turn on the selection transistor SX. The reset transistor RX may couple a floating diffusion node FD to a reset voltage VDD in response to a reset signal RST in a first sampling period. For reference, the reset voltage VDD may include a power supply voltage VDD. The driving transistor DX may pull up level of the output node OUT in response to the voltage of the floating diffusion node FD. Through the above-described processes, the level of the pixel signal PX outputted to the output node OUT is set to a reset level which is also referred to as a reference level.

The transmission transistor TX may transmit photo-charges generated by the photo-diode PD in response to a transmission signal TRA in a second sampling period. The driving transistor DX may pull up level of the output node OUT in response to the voltage of the floating diffusion node FD. Through the above-described process, the level of the pixel signal PX outputted to the output node OUT is set to a video level which is decided according to the amount of photo-charges which the photo-diode PD generates on the basis of light incident on the pixel unit 210. For reference, a time required for integrating the photo-charges generated by the photo-diode PD in response to the light which is incident before the pixel signal PX is sampled refers to an integration time.

During the first sampling period, the signal sampling unit 220 samples the pixel signal PX having the reset level. The first switch SW1 of the signal sampling unit 220 is configured to be turned on in response to a first sampling signal SAM1 which is activated during the first sampling period, and transmit the voltage of the output node OUT to a first capacitor C1. When the first sampling period is ended and the first switch SW1 is turned on, the first capacitor C1 maintains the voltage across the first capacitor C1 to a level at the time point where the second sampling period is ended. In a state where the second switch SW1 is turned on, the voltage of the output node OUT and the voltage of one end N1 of the first capacitor C1 are changed substantially in the same manner.

During the second sampling period, the signal sampling unit 220 samples the pixel signal PX having the video level. The second switch SW2 of the signal sampling unit 220 is configured to be turned on in response to a second sampling signal SAM2 which is activated during the second sampling period, and transmit the voltage of the output node OUT to the second capacitor C2. When the second sampling period is ended and the second switch SW2 is turned on, the second capacitor C2 maintains the voltage across the second capacitor C2 to a level at a time point where the second sampling period is ended. In a state where the second switch SW2 is turned on, the voltage of the output node OUT and the voltage of one end N2 of the second capacitor C2 are changed substantially in the same manner.

Here, the reset-level pixel signal PX and the video-level pixel signal PX are sampled, in order to remove and offset fixed pattern noise (hereafter, referred to as FPN) related to inconsistency of the signal processing circuit of the sensor through correlated-double sampling (CDS). For reference, the first current sinking unit 230 serving as a biasing circuit is configured to sink a current from the output node OUT.

The pixel data generation unit 240 is configured to generate pixel data DATA by performing analog-to-digital conversion using the voltages across the first and second capacitors C1 and C2, when the sampling is completed. Since the process of converting the sampled pixel signal PX into the pixel data is well known to those skilled in the art to which the present invention pertains, the descriptions thereof are omitted herein. For reference, the sampled voltage may be amplified before the analog-digital conversion.

Figure 3:
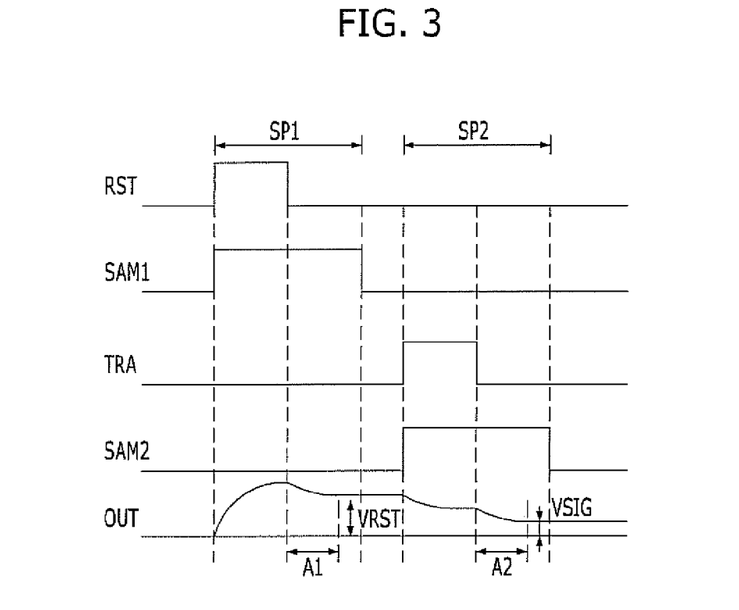
FIG. 3 is a waveform diagram explaining the operation of the image sensor shown in FIG. 2.

FIG. 3 is a waveform diagram explaining the operation of the image sensor of FIG. 2.

Hereafter, it is assumed that the selection transistor SX is turned on, in order to describe the operation of the enabled pixel unit 210.

When the first sampling period SP1 starts, the reset signal RST and the first sampling signal SAM1 are activated. When the reset signal RST is activated, the reset transistor RX is turned on to pull up the floating diffusion node FD to the reset voltage VDD, in response to the reset signal RST. The driving transistor DX pulls up the output node OUT in response to the voltage of the floating diffusion node FD. Through the above-described process, the level of the pixel signal PX outputted to the output node OUT is set to the reset level. When the first sampling signal SAM1 is activated, the first switch SW1 is turned on, and the output node OUT and the one end N1 of the first capacitor C1 are electrically coupled. Therefore, the pixel signal PX outputted to the output node OUT is transmitted to the one end N1 of the first capacitor C1. In a state where the first switch SW1 is turned on, the voltage of the output node OUT and the voltage of the one end N1 of the first capacitor C1 are changed substantially in the same manner.

When the reset signal RST is deactivated, the floating diffusion node FD is not pulled up to the reset voltage VDD. Therefore, the voltage of the floating diffusion node FD and the level of the pixel signal PX outputted to the output node OUT should be maintained to a constant value. However, the voltage of the floating diffusion node FD is influenced by the level ('low') of the reset signal RST and then slightly decreased, due to the above-described clock feedthrough. When the voltage level of the floating diffusion signal FD is decreased, the driving transistor DX adjusts the output node OUT to a different level. Therefore, the level of the pixel signal PX outputted to the output node OUT is also decreased. In order to accurately sample the pixel signal PX, the sampling should be completed at a time point where the level of the pixel signal PX is constantly maintained to the reset level VRST after the decrease is completed. However, the first capacitor C1 coupled to the output node OUT hinders the change in voltage of the output node OUT. Furthermore, the driving transistor DX may serve as a source follower which decreases an output voltage at a lower speed than when raising the output voltage. Accordingly, as the level of the pixel signal PX is slowly decreased, the completion of the sampling is delayed (that is, a period A1 is lengthened). Therefore, the first sampling signal SAM1 should be activated until the voltage of the output node OUT is stabilized (or settled), and the sampling speed slows down.

When the second sampling period SP2 starts, the transmission signal TRA and the second sampling signal SAM2 are activated. When the transmission signal TRA is activated, the transmission transistor TX is turned on in response to the transmission signal TRA, to transmit photo-charges to the floating diffusion node FD. The driving transistor DX pulls up the output node OUT in response to the voltage of the floating diffusion node FD. Through the above-described process, the level of the pixel signal PX outputted to the output node OUT is set to the video level. When the second sampling signal SAM2 is activated, the second switch SW2 is turned on, and the output node OUT and the one end N2 of the second capacitor C2 are electrically coupled. Therefore, the pixel signal PX outputted to the output node OUT is transmitted to the one end N2 of the second capacitor C2.

For reference, the voltage (or the level of the pixel signal PX) of the output node OUT in each period is changed as shown in FIG. 3. In a state where the first sampling signal SAM1 is activated, the voltage of the one end N1 of the first capacitor C1 has a similar waveform to the voltage of the output node OUT. Furthermore, in a state where the second sampling signal SAM2 is activated, the voltage of the one end N2 of the second capacitor C2 has a similar waveform to the voltage of the output node OUT.

Even when the transmission signal TRA is deactivated, the same phenomenon as in the first sampling period SP1 occurs. The required time increases for stabilizing the level of the pixel signal PX, which is outputted to the output node OUT, as the video level VSIG (that is, a period A2 increases). Therefore, the sampling speed slows down.

Figure 4:
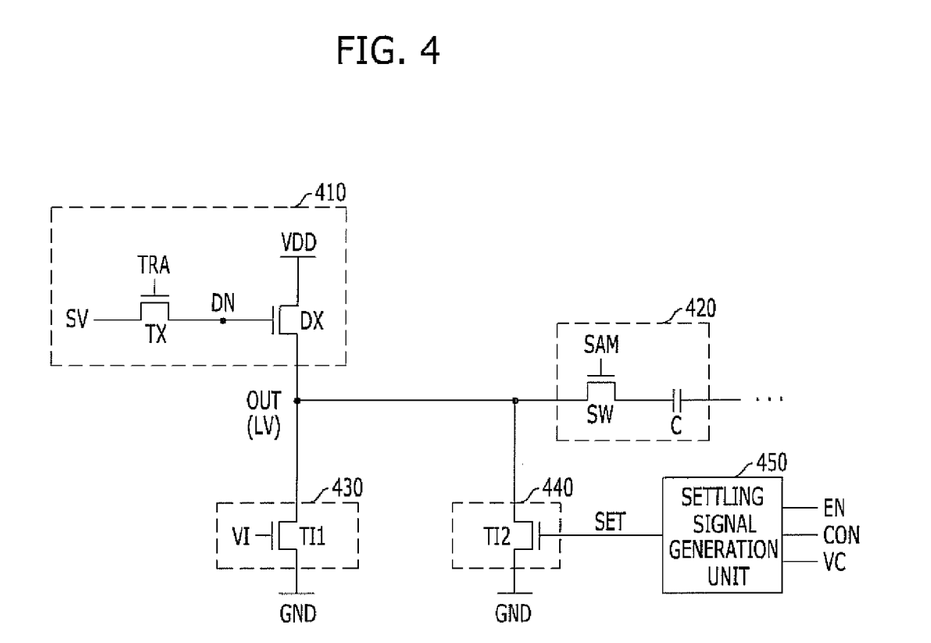
FIG. 4 is a configuration diagram of a signal sampling circuit in accordance with an embodiment of the present invention.

FIG. 4 is a configuration diagram of a signal sampling circuit in accordance with an embodiment of the present invention.

Referring to FIG. 4, the signal sampling circuit includes a signal output unit 410, a signal sampling unit 420, a first current sinking unit 430, and a second current sinking unit 440, and a settling signal generation unit 450. The signal output unit 410 is configured to output a level signal LV to an output node OUT in response to a control signal CON. The signal sampling unit 420 is coupled to the output node OUT and configured to sample the level signal LV in a sampling period. The first current sinking unit 430 is configured to sink a constant current from the output node OUT. The second current sinking unit 440 is configured to sink a current from the output node OUT after a time point where the control signal CON is deactivated.

Hereafter, referring to FIG. 4, the signal sampling circuit will be described.

The signal output unit 410 includes a transmission transistor T configured to transmit a signal voltage SV to a driving node DN in response to the control signal CON and a driving transistor D configured to pull up the output node OUT in response to the voltage of the driving node DN. During the sampling period, the signal output unit 410 outputs the level signal LV, whose level is decided according to the voltage of the driving node DN, to the output node OUT in response to the control signal CON.

The signal sampling unit 420 includes a switch SW and a capacitor C coupled in series to the switch SW. The signal sampling unit 420 is configured to output the level signal LV outputted to the output node OUT during the sampling period. The switch SW is turned on or off in response to a sampling signal SAM which is activated in the sampling period. For reference, the switch SW may be a transistor having one end coupled to the output node OUT and the other end coupled to one end N of the capacitor C. The switch SW is configured to be turned on or off in response to the sampling signal SAM. In a state where the switch SW is turned on, the voltage of the output node OUT and the voltage of the one end N of the capacitor C are changed substantially in the same manner.

The first current sinking unit 430 serves as a biasing circuit to sink a constant current from the output node OUT. For reference, the first current sinking unit 430 may include a transistor TI1 having one end coupled to the output node OUT and the other end coupled to a ground voltage terminal. The transistor TI1 is configured to receive a fixed bias voltage VI through a gate thereof.

The second current sinking unit 440 sinks a current from the output node OUT until a time point where the sampling is completed after a time point where the control signal CON is deactivated, thereby reducing a required time for the transition of the level of the level signal LV which is outputted to the output node OUT.

The operation of the signal sampling circuit, based on the function of the second current sinking unit 440, will be described in more detail.

When the sampling period starts, the control signal CON and the sampling signal SAM are activated. When the control signal CON is activated, the transmission transistor TX is turned on to transmit the signal voltage SV to the driving node DN. The driving transistor DX pulls up the output node OUT in response to the voltage of the driving node DN. Through the above-described process, the level of the level signal LV outputted to the output node OUT is set to a signal level which is decided according to the level of the signal voltage SV. Here, the reason why the level of the level signal LV is decided according to the voltage of the driving node DN is that the drivability of the driving transistor DX to control the output node OUT depends on the voltage of the driving node DN. When the sampling signal SAM is activated, the switch SW is turned on, and the output node OUT and the one end N of the capacitor C are electrically coupled. Therefore, the level signal LV outputted to the output node OUT is transmitted to the one end N of the capacitor C.

When the control signal CON is inactivated, the voltage of the driving node DN and the level of the level signal LV outputted to the output node OUT should be maintained to a constant value. As described above with reference to FIG. 3, however, the voltage of the driving node DN is decreased to a certain degree by the clock feedthrough, and then stabilized to the signal level. When the voltage of the driving node DN is decreased, the drivability of the driving transistor DX to pull up the output node OUT is reduced. Therefore, the level of the level signal LV outputted to the output node OUT is also decreased. At this time, level of the level signal LV slowly decreases due to the properties of the capacitor C and the driving transistor D.

Here, in order that the level of the level signal LV decreases more quickly, the second current sinking unit 340, which is enabled from a timing of inactivating the control signal CON to the end of sampling period, may be used to sink a current from the output node OUT. Then, when the sampling is completed, the sampling signal SAM is deactivated to turn off the switch SW, and the voltage across the capacitor C is maintained to a level corresponding to the sampled level signal LV.

Here, the period in which the second current sinking unit 440 is enabled may differ depending on the design. When a current is excessively sunk from the output node OUT through the second current sinking unit 440, the level of the level signal LV may become lower than a stabilized level of the level signal LV, i.e., a level corresponding to the voltage of the driving node DN which is changed by the above-described clock feedthrough. Therefore, the period of enabling the second current sinking unit 440 and the amount of current sunk from the output node OUT by the second current sinking unit 440 may be decided through a test within such a range to have no effect upon the level of the level signal LV after the level signal LV is stabilized. The second current sinking unit 440 may include a transistor TI2, coupled to the output node OUT and the ground voltage terminal, configured to be turned on or off in response to a settling signal SET which is activated from a timing of inactivating the control signal CON to the end of sampling period.

The settling signal generation unit 450 is configured to generate the settling signal SET to control the second current sinking unit 440. At this time, the control signal CON may be used to generate the settling signal SET such that the settling signal SET is activated from a timing of inactivating the control signal CON to the end of sampling period. More specifically, the settling signal generation unit 450 may generate the settling signal SET by combining the control signal CON and an inverted delayed signal DCON obtained by processes of inverting and delaying the control signal CON. Furthermore, the settling signal generation unit 450 may control the level of the settling signal SET using a control voltage VC. Here, the activation period of the settling signal SET, that is, the period of enabling the second current sinking unit 440 to sink a current from the output node OUT, is decided according to a delay value of the inverted delayed signal DCON. The amount of current, which is sunk per unit time from the output node OUT by the second current sinking unit 440, is decided according to the level of the settling signal SET. The detailed configuration and operation of the settling signal generation unit 450 will be described below with reference to FIG. 7.

In order to accurately sample the level signal LV, the sampling period should be completed after the level signal LV is determined based on the voltage change of the driving node DN, which is caused by the clock feed through. That is, after the level of the level signal LV is stabilized to the signal level by the voltage change of the driving node DN, the sampling period should be completed. The signal sampling circuit in accordance with the embodiment of the present invention enables the second current sinking unit 440 to sink a current from the output node OUT until a predetermined period from a timing of inactivating the control signal CON. Therefore, the level of the level signal LV may be more rapidly changed, and the sampling period may be quickly completed. That is, the sampling speed may increase, and noise caused by the clock feed through may be reduced.

Figure 5:
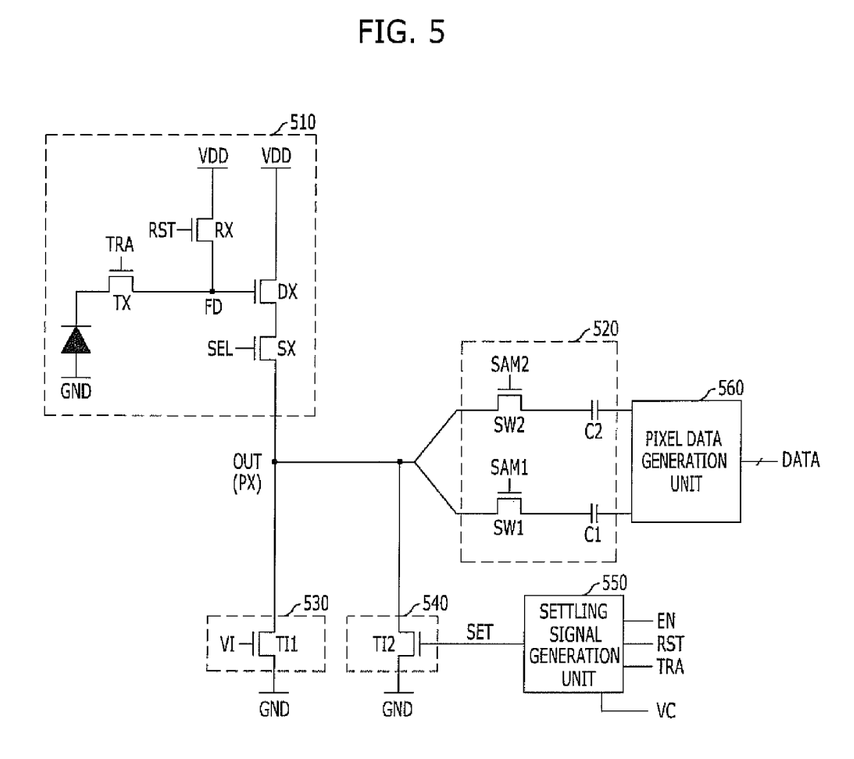
FIG. 5 is a configuration diagram of an image sensor in accordance with an embodiment of the present invention.

FIG. 5 is a configuration diagram of an image sensor in accordance with an embodiment of the present invention. The image sensor of FIG. 5 increases a sampling speed while removing noise, using the same principle as the signal sampling circuit of FIG. 4.

Referring to FIG. 5, the image sensor includes a pixel unit 510, a signal sampling unit 520, a first current sinking unit 530, a second current sinking unit 540, a settling signal generation unit 550, and a pixel data generation unit 560. The pixel unit 510 is configured to output a pixel signal PX to an output node OUT in response to a reset signal RST or transmission signal TRA. The signal sampling unit 520 is coupled to the output node OUT and configured to sample the pixel signal PX in a first sampling period or a second sampling period. The first current sinking unit 530 is configured to sink a constant current from the output node OUT. The second current sinking unit 540 is configured to sink a current from the output node OUT after a timing of inactivating the reset signal RST, the transmission signal TRA, or both. The pixel data generation unit 560 is configured to generate pixel data DATA using the sampled pixel signal PX. Here, the pixel unit 510 includes a photo-diode PD, a reset transistor RX, a transmission transistor TX, a driving transistor DX, and a selection transistor SX. The photo-diode PD is configured to generate photo-charges in response to incident light. The reset transistor RX is configured to drive a floating diffusion node FD to a reset voltage VDD in response to the reset signal RST. The transmission transistor TX is configured to transmit the photo-chares generated by the photo-diode PD to the floating diffusion node FD in response to the transmission signal TRA. The driving transistor DX is configured to pull up the output node OUT in response to the voltage of the floating diffusion node FD. The selection transistor SX is configured to be turned on in response to a select signal SEL when a pixel unit corresponding to the selection transistor SX is selected.

The first current sinking unit 530 serves as a biasing circuit and is configured to sink a constant current from the output node OUT. For reference, the first current sinking unit 530 may include a transistor TI1, which is coupled to the output node OUT and a ground voltage terminal, configured to receive a fixed bias voltage VI through a gate thereof.

Hereafter, referring to FIG. 5, the image sensor will be described.

The pixel unit 510 outputs the pixel signal PX to the output node OUT when the pixel unit 510 is selected to turn on the selection transistor SX. In the following descriptions, it is assumed that the pixel unit 510 of FIG. 5 is selected and the selection transistor SX is turned on.

When a first sampling period starts, the reset signal RST and the first sampling signal SAM1 are activated. The reset transistor RX drives the floating diffusion node FD to the reset voltage VDD in response to the activated reset signal RST. The driving transistor DX pull up the output node OUT in response to the voltage of the floating diffusion node FD. Through the above-described processes, the level of the pixel signal PX outputted to the output node OUT is set to the reset level. For reference, the voltage level of the output node OUT is decided according to the voltage of the floating diffusion node FD.

During the first sampling period, the signal sampling unit 520 samples the pixel signal PX having the reset level. More specifically, when the first sampling signal SAM1 is activated, the first switch SW1 of the signal sampling unit 520 is turned on to transmit the pixel signal PX, outputted to the output node OUT, into one end N1 of the first capacitor C1. When the first switch SW1 is turned on, the voltage of the output node OUT and the voltage at the one end N1 of the first capacitor C1 are changed substantially in the same manner.

When the reset signal RST is deactivated, the voltage of the floating diffusion node FD and the level of the pixel signal PX should be maintained to a constant value. As described above with reference to FIG. 2, however, the voltage level of the floating diffusion node FD is slightly decreased by clock feedthrough. When the voltage of the floating diffusion node FD is decreased, the drivability of the driving transistor DX to pull up the output node OUT is reduced. Therefore, the level of the pixel signal PX outputted to the output node OUT is decreased.

At this time, the speed at which the pixel signal PX is decreased slows down due to the properties of the first capacitor C1 and the driving transistor DX. Therefore, in order to rapidly decrease the level of the pixel signal PX to a level corresponding to the level of the floating diffusion node FD, the second current sinking unit 550 is enabled to sink a current from the output node OUT from a timing of inactivating the reset signal RST to a timing of completing the first sampling period. When the first sampling period is completed, the first sampling signal SAM1 is deactivated to turn off the first switch SW1, and the voltage across the first capacitor C1 is maintained to a level corresponding to the sampled pixel signal PX.

When a second sampling period starts, the transmission signal TRA and the second sampling signal SAM2 are activated. The transmission transistor TX transmits the photo-charges generated by the photo-diode PD to the floating diffusion node FD in response to the activated transmission signal TRA. The driving transistor DX pulls up the output node OUT in response to the voltage of the floating diffusion node FD. Through the above-described processes, the level of the pixel signal PX outputted to the output node OUT is set to a video level.

During the second sampling period, the signal sampling unit 520 samples the pixel signal PX having the video level. More specifically, when the second sampling signal SAM2 is activated, the second switch SW2 of the signal sampling unit 520 is turned on to transmit the pixel signal PX to one end N2 of the second capacitor C2. When the second switch SW2 is turned on, the voltage of the output node OUT and the voltage at the one end N2 of the second capacitor C2 are changed substantially in the same manner.

When the transmission signal TRA is deactivated, the voltage of the floating diffusion node FD and the level of the pixel signal PX outputted to the output node OUT should be maintained to a constant value. However, since clock feedthrough occurs as in the first sampling period, the voltage of the floating diffusion node FD is decreased. Therefore, in order to quickly reflect the decreased voltage of the floating diffusion node FD into the pixel signal PX as in the first sampling period, the second current sinking unit 450 is enabled to sink a current from the output node OUT from a timing of inactivating the transmission signal TRA to a timing of completing the second sampling period. When the second sampling period is completed, the second sampling signal SAM2 is deactivated to turn off the second switch W2. Accordingly, the voltage across the capacitor C2 is maintained to a level corresponding to the sampled pixel signal PX.

Here, the period in which the second current sinking unit 540 is enabled may differ depending on the design. When a current is excessively sunk from the output node OUT through the second current sinking unit 540, the level of the pixel signal PX may become lower than the stabilized level of the pixel signal PX, that is, a level corresponding to the voltage of the floating diffusion node FD which is changed by the above-described clock feedthrough. Therefore, the activated period of the second current sinking unit 540 and the amount of current sunk from the output node OUT by the second current sinking unit 540 may be decided, through a test, within such a range to have no effect upon the level of the pixel signal PX after the pixel signal PX is stabilized.

The second current sinking unit 540 may include a transistor TI2 having one end coupled to the output node OUT and the other end coupled to a ground voltage terminal and configured to be turned on or off in response to a settling signal SET. The settling signal SET is activated between a time point where the reset signal RST is deactivated and a time point where the first sampling period is ended, or between a time point where the transmission signal TRA is deactivated and a time point where the second sampling period is ended.

The settling signal generation unit 550 is configured to generate the settling signal SET to control the second current sinking unit 540. Using the reset signal RST, the settling signal generation unit 550 may generate the settling signal SET such that the settling signal SET is activated from the time point where the reset signal RST is deactivated to the time point where the first sampling period is ended. Otherwise, the settling signal generation unit 550 may generate the settling signal SET based on the transmission signal TRA such that the settling signal SET is activated from the time point where the transmission signal TRA is deactivated to the time point where the second sampling period is ended.

More specifically, the settling signal generation unit 550 may generate the settling signal SET by combining the reset signal RST and a first delay signal DRST obtained by inverting and delaying the reset signal RST or may generate the settling signal SET by combining the transmission signal TRA and a second delay signal DTRA obtained through processes of inverting and delaying the transmission signal TRA. Furthermore, the settling signal generation unit 550 may control the level of the settling signal SET, using a control voltage VC.

Here, the period for enabling the second current sinking unit 540 to sink a current from the output node OUT is decided according to delay values of the first and second delay signals DRST and DTRA. Furthermore, the amount of current sunk per unit time from the output node OUT by the second current sinking unit 540 is decided according to the level of the settling signal SET. The detailed configuration and operation of the settling signal generation unit 550 will be described below with reference to FIG. 6.

The pixel data generation unit 560 generates the pixel data DATA by performing analog-to-digital conversion based on the voltages across the first and second capacitors C1 and C2, that is, voltages corresponding to the pixel signals PXs respectively sampled in the first sampling period and the second sampling period, when the sampling is completed. Since the process of converting the sampled pixel signals PX into the pixel data DATA is well known to those skilled in the art to which the present invention pertains, the descriptions thereof are omitted herein. For reference, the pixel data generation unit 560 may amplify the sampled voltages before the analog-to-digital conversion.

In order to accurately sample the pixel signal PX, the sampling period should be completed after the pixel signal PX is determined based on the voltage change of the floating diffusion node FD, which is caused by the clock feed through, as well as the level of the pixel signal PX is decreased and stabilized. The image sensor in accordance with the embodiment of the present invention enables the second current sinking unit 540 to sink a current from the output node OUT during a predetermined period from a time point where the reset signal RST or the transmission signal TRA is deactivated. Accordingly, as the level of the pixel signal PX more rapidly approaches the stabilization level, the sampling period may be quickly completed. That is, the pixel signal may be quickly sampled while noise caused by the clock feed through may be removed.

For reference, the signal sampling unit 520 is not limited to the above-described configuration. The configuration of the signal sampling unit 520 may be changed according to the design, as long as the configuration can perform correlated-double sampling.

Figure 6:
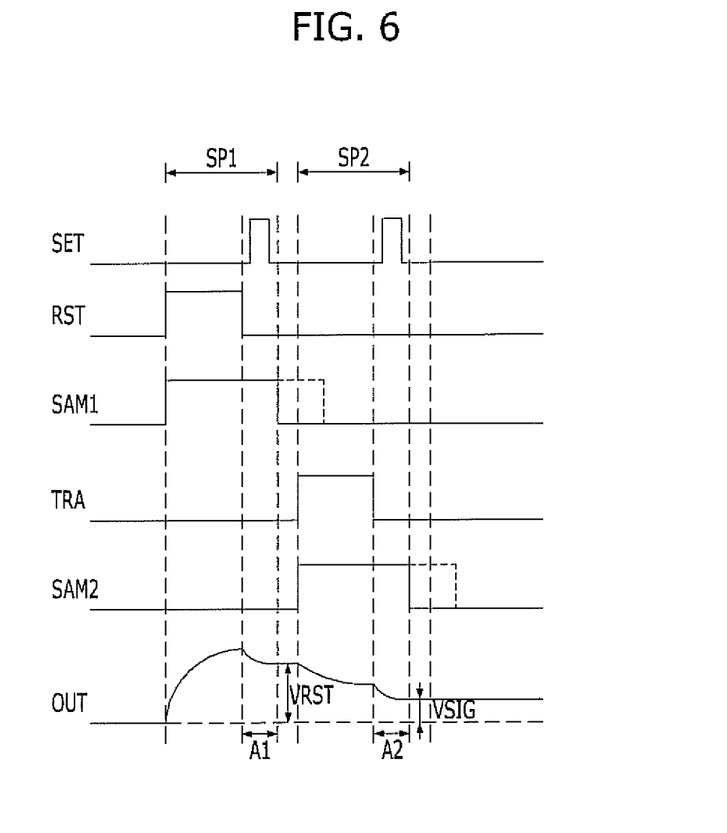
FIG. 6 is a waveform diagram explaining the operation of the image sensor shown in FIG. 5.

FIG. 6 is a waveform diagram explaining the operation of the image sensor of FIG. 5.

Hereafter, it is assumed that the selection transistor SX is turned on in order to describe the operation of the enabled pixel unit 510.

When the first sampling period SP1 starts, the reset signal RST and the first sampling signal SAM1 are activated. When the reset signal RST is activated, the reset transistor RX is turned on to pull-up drive the floating diffusion node FD to the reset voltage VDD, in response to the reset signal RST. The driving transistor DX pulls up the output node OUT in response to the voltage of the floating diffusion node FD. Through the above-described processes, the level of the pixel signal PX outputted to the output node OUT may be set to the reset level. When the first sampling signal SAM1 is activated, the first switch SW1 is turned on, and then the output node OUT and the one end N1 of the first capacitor C1 are electrically coupled. Therefore, the pixel signal PX outputted to the output node OUT is transmitted to the end N1 of the first capacitor C1.

When the reset signal RST is deactivated, the settling signal SET is activated. During the period where the settling signal SET is activated, the second current sinking unit 540 sinks a current from the output node OUT. Therefore, the voltage of the output node OUT is rapidly decreased, and the level of the pixel signal PX is rapidly stabilized to the reset level VRST (a period A1 is shortened). Therefore, the first sampling period may be quickly completed, that is, the first sampling signal SAM1 is deactivated fast.

When the second sampling period SP2 starts, the transmission signal TRA and the second sampling signal SAM2 are activated. When the transmission signal TRA is activated, the transmission transistor TX is turned on to transmit the photo-charges generated by the photo-diode PD to the floating diffusion node FD, in response to the transmission signal TA. The driving transistor DX pull up the output node OUT in response to the voltage of the floating diffusion node FD. Through the above-described processes, the level of the pixel signal PX outputted to the output node OUT is set to the video level. When the second sampling signal SAM2 is activated, the second switch SW2 is turned on, and then the output node OUT and the one end N2 of the second capacitor C2 are electrically coupled. Therefore, the pixel signal PX outputted to the output node OUT is transmitted to the one end N2 of the second capacitor C2.

When the transmission signal TRA is deactivated, the settling signal SET is activated. During the period where the settling signal SET is activated, the second current sinking unit 540 sinks a current from the output node OUT. Therefore, the voltage of the output node OUT is rapidly decreased, as well as the level of the pixel signal PX is rapidly stabilized to the video level VSIG (a period A2 is shortened). Therefore, the second sampling period may be quickly completed, that is, the second sampling signal SAM2 is deactivated.

For reference, the voltage of the output node OUT (or the level of the pixel signal PX) in each period is changed as shown in FIG. 3. In a state where the first sampling signal SAM1 is activated, the voltage of the one end N1 of the first capacitor C1 has a similar waveform to the voltage of the output node OUT. Furthermore, in a state where the second sampling signal SAM2 is activated, the voltage of the one end N2 of the second capacitor C2 has a similar waveform to the voltage of the output node OUT.

Figure 7:
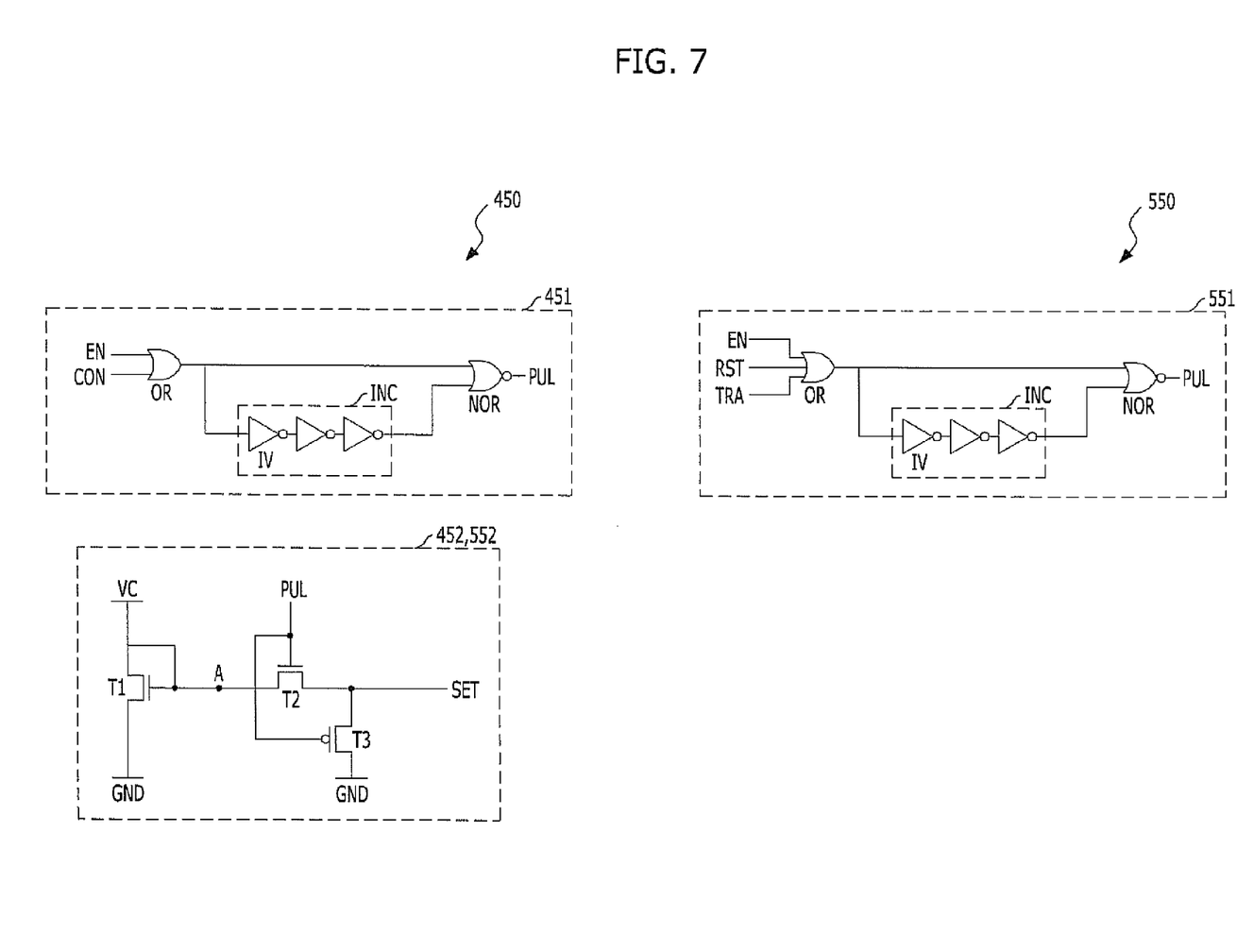
FIG. 7 is a configuration diagram of a settling signal generation unit of FIG. 4 and a settling signal generation unit shown in FIG. 5 in accordance with the embodiment of the present invention.

FIG. 7 is a configuration diagram of the settling signal generation unit 450 of FIG. 4 and the settling signal generation unit 550 of FIG. 5 in accordance with the embodiment of the present invention.

Referring to FIG. 7, the settling signal generation units 450 and 550 include pulse signal generation units 451 and 551 and level control unit 452 and 552, respectively. The following descriptions will be divided into the settling signal generation unit 450 of FIG. 4 and the settling signal generation unit 550 of FIG. 5.

(1) Settling Signal Generation Unit 450 of FIG. 4

The pulse signal generation unit 451 is configured to generate a pulse signal PUL by combining the control signal CON and an inverted delayed signal DCON, which is generated by processes of passing the control signal CON through an inverter chain INC and logically combining the inverted signal through a NOR gate NOR, when the control signal CON is deactivated while an enable signal EN is activated to a low level. At this time, an activation period of the pulse signal PUL corresponds to a delay value of the inverter chain INC. Here, the inverter chain INC includes an odd number of inverters IV. For reference, the pulse signal generation unit 451 includes an OR gate OR.

The level control unit 452 is configured to control the activation level of the pulse signal PUL to the same level as the control voltage VC and generate the settling signal SET. The level control unit 452 includes first to third transistors T1 to T3. When the pulse signal PUL is in a high level, the second transistor T2 is turned on (the third transistor T3 is turned off) to transmit the voltage of a node A as the settling signal SET. When the pulse signal PUL is at a low level, the third transistor T3 is turned on (the second transistor T2 is turned off) to transmit a ground voltage GND as the settling signal SET.

(2) Settling Signal Generation Unit 550 of FIG. 5

The pulse signal generation unit 551 is configured to generate a pulse signal PUL by combining the reset signal RST and a first delay signal DRST, which is generated by processes of passing the reset signal RST through an inverter chain INC and logically combining the inverted signal through a NOR gate NOR, when the reset signal RST is deactivated while an enable signal EN is activated to a low level. Also, the pulse signal generation unit 551 is configured to generate a pulse signal PUL by combining the transmission signal TRA and a second delay signal DTRA, which is generated by passing the transmission signal TRA through the inverter chain INC and logically combining the inverted signal through the NOR gate NOR, when the transmission signal is deactivated. At this time, the deactivation period of the pulse signal PUL corresponds to the delay value of the inverter chains INC. Here, the inverter chain INC includes an odd number of inverters IV. For reference, the pulse signal generation unit 551 includes an OR gate OR. The configuration and operation of the level control unit 552 may be the same as the above-described level control unit 452.

In accordance with the embodiments of the present invention, it is possible to increase the sampling speed while removing noise caused by clock feedthrough.

While the present invention has been described with respect to the specific embodiments, it will be apparent to those skilled in the art that various changes and modifications may be made without departing from the spirit and scope of the invention as defined in the following claims.

What is claimed is:

1. A signal sampling circuit comprising:
   a signal output unit configured to output a level signal to an output node in response to a control signal;
   a signal sampling unit coupled to the output node and configured to sample the level signal in a sampling period;
   a first current sinking unit configured to sink a constant current from the output node; and
   a second current sinking unit configured to sink a current from the output node after a time point where the control signal is deactivated.

2. The signal sampling circuit of claim 1, wherein the second current sinking unit is enabled until a time point where the sampling period is ended.

3. The signal sampling circuit of claim 2, wherein the second current sinking unit sinks a current from the output node in response to a settling signal which is activated between a time point where the control signal is deactivated and a time point where the sampling period is ended.

4. The signal sampling circuit of claim 3, wherein the settling signal comprises a signal which is generated using the control signal.

5. The signal sampling circuit of claim 4, wherein the second current sinking unit comprises a transistor having one end coupled to the output node and configured to be turned on/off in response to the settling signal.

6. The signal sampling circuit of claim 4, further comprising a settling signal generation unit configured to generate the settling signal by combining the control signal and an inverted delayed signal obtained by inverting and delaying the control signal.

7. The signal sampling circuit of claim 6, wherein the settling signal generation unit generates the settling signal by controlling the level of a pulse signal generated by combining the control signal and the inverted delayed signal.

8. An image sensor comprising:
   a pixel unit configured to output a pixel signal to an output node in response to a reset signal or transmission signal;
   a signal sampling unit coupled to the output node and configured to sample the pixel signal in a first sampling period or second sampling period;
   a first current sinking unit configured to sink a constant current from the output node; and
   a second current sinking unit configured to sink a current from the output node after one or more time points of a time point where the reset signal is deactivated and a time point where the transmission signal is deactivated.

9. The image sensor of claim 8, wherein the second current sinking unit sinks a current from the output node until a time point where the first sampling period is ended when the second current sinking unit sinks a current from the output node after a time point where the reset signal is deactivated and the second sampling period is ended when the second current sinking unit sinks a current from the output node after a time point where the transmission signal is deactivated.

10. The image sensor of claim 9, wherein the second current sinking unit sinks a current from the output node in response to a settling signal which is activated between a time point where the reset signal is deactivated and a time point where the first sampling period is ended or between a time point where the transmission signal is deactivated and a time point where the second sampling period is ended.

11. The image sensor of claim 10, wherein the settling signal comprises a signal which is generated using the reset signal or the transmission signal.

12. The image sensor of claim 11, wherein the second current sinking unit comprises a transistor having one end coupled to the output node and configured to be turned on/off in response to the settling signal.

13. The image sensor of claim 8, wherein the pixel unit comprises:
   a photo-diode configured to generate photo-charges in response to incident light;
   a reset transistor configured to drive a floating diffusion node to a reset voltage in response to the reset signal;
   a transmission transistor configured to transmit the photo-charges generated by the photo-diode to the floating diffusion node in response to the transmission signal; and
   a driving transistor configured to pull-up drive the output node in response to the voltage of the floating diffusion node.

14. The image sensor of claim 13, further comprising a pixel data generation unit configured to generate pixel data corresponding to the light incident on the photo-diode, using the pixel signal sampled in the first sampling period and the pixel signal sampled in the second sampling period.

15. The image sensor of claim 10, further comprising a settling signal generation unit configured to generate the settling signal by combining the reset signal and a first delay signal obtained by inverting and delaying the reset signal or combining the transmission signal and a second delay signal obtained by inverting and delaying the transmission signal.

* * * * *